(12) United States Patent
Choi et al.

(10) Patent No.: US 11,171,074 B2
(45) Date of Patent: Nov. 9, 2021

(54) HEAT SINK BOARD, MANUFACTURING METHOD THEREOF, AND SEMICONDUCTOR PACKAGE INCLUDING THE SAME

(71) Applicant: JMJ Korea Co., Ltd., Bucheon-si (KR)

(72) Inventors: Yun Hwa Choi, Bucheon-si (KR); Jeonghun Cho, Goyang-si (KR)

(73) Assignee: JMJ Korea Co., Ltd., Bucheon-si (KR)

(*) Notice: Subject to any disclaimer, the term of this patent is extended or adjusted under 35 U.S.C. 154(b) by 0 days.

(21) Appl. No.: 16/923,093

(22) Filed: Jul. 8, 2020

(65) Prior Publication Data
US 2021/0118768 A1    Apr. 22, 2021

(30) Foreign Application Priority Data

Oct. 18, 2019  (KR) .................. 10-2019-0129694

(51) Int. Cl.
| | | |
|---|---|---|
| *H01L 23/373* | (2006.01) | |
| *H01L 21/48* | (2006.01) | |
| *H01L 25/07* | (2006.01) | |
| *H01L 25/18* | (2006.01) | |
| *H01L 23/367* | (2006.01) | |

(52) U.S. Cl.
CPC ...... *H01L 23/3735* (2013.01); *H01L 21/4871* (2013.01); *H01L 23/367* (2013.01); *H01L 23/3736* (2013.01); *H01L 25/072* (2013.01); *H01L 25/18* (2013.01)

(58) Field of Classification Search
CPC ............ H01L 21/4871; H01L 23/367; H01L 23/3735; H01L 23/3736
See application file for complete search history.

(56) References Cited

U.S. PATENT DOCUMENTS

| | | | |
|---|---|---|---|
| 2006/0057768 A1* | 3/2006 | Nakanishi ........... | H01L 23/3732 438/106 |
| 2007/0257343 A1* | 11/2007 | Hauenstein ........... | H01L 25/072 257/676 |
| 2013/0062743 A1* | 3/2013 | Kim ..................... | H01L 24/41 257/675 |
| 2019/0189548 A1* | 6/2019 | Ohashi ................. | H01L 23/13 |
| 2021/0082780 A1* | 3/2021 | Takizawa ............. | H01L 23/3735 |

FOREIGN PATENT DOCUMENTS

| | | |
|---|---|---|
| JP | 2003-168769 A | 6/2003 |
| JP | 2004-311650 A | 11/2004 |
| JP | 2004-356625 A | 12/2004 |
| JP | 2005-011922 A | 1/2005 |
| JP | 2010-238965 A | 10/2010 |

* cited by examiner

*Primary Examiner* — Allan R Wilson
(74) *Attorney, Agent, or Firm* — Park, Kim & Suh, LLC (57) ABSTRACT

A heat sink board according to an embodiment of the present invention includes a heat sink layer, an insulated layer formed on the heat sink layer, and a metal layer formed on the insulated layer, wherein both end parts of the heat sink layer and both end parts of the insulated layer are respectively projected further than the both end parts of the metal layer.

17 Claims, 8 Drawing Sheets

HEAT SINK BOARD, MANUFACTURING METHOD THEREOF, AND SEMICONDUCTOR PACKAGE INCLUDING THE SAME

CROSS-REFERENCE TO RELATED PATENT APPLICATION

This application claims the benefit of Korean Patent Application No. 10-2019-0129694, filed on Oct. 18, 2019, in the Korean Intellectual Property Office, the disclosure of which is incorporated herein in its entirety by reference.

BACKGROUND OF THE INVENTION

1. Field of the Invention

The present invention relates to a heat sink board, a manufacturing method thereof, and a semiconductor package including the heat sink board, and more particularly, to a heat sink board which may reduce damage occurring due to external shock and manufacturing costs, a manufacturing method thereof, and a semiconductor package including the heat sink board.

2. Description of the Related Art

In general, a semiconductor package includes a printed circuit board (PCB), a semiconductor chip formed on the PCB, a lead frame electrically connecting the semiconductor chip to the outside through wire bonding, and a package housing covering the PCB.

Here, the PCB may be used as a heat sink board for releasing heat generated from the semiconductor chip to the outside. The heat sink board may generally include a ceramic insulated board and upper and lower metal layers respectively formed on upper and lower parts of the ceramic insulated board. In such a heat sink board, both end parts of the ceramic insulated board interposed between the upper metal layer and the lower metal layer are projected further than both end parts of the upper metal layer and the lower metal layer for releasing heat.

Accordingly, the ceramic insulated board projected further toward the outside than the upper metal layer and the lower metal layer may be easily damaged by external shock.

Also, since a thickness of the ceramic insulated board used to release heat needs to be 200 um to 300 um, a thickness of the heat sink board increases and thus, manufacturing costs also increase. In addition, when an additional heat sink board is attached below a heat sink layer in order to release more heat, a thickness of the heat sink board increases more and thereby, manufacturing costs also increase.

SUMMARY OF THE INVENTION

The present invention provides a heat sink board which may reduce damage occurring due to external shock and manufacturing costs, a manufacturing method thereof, and a semiconductor package including the heat sink board.

According to an aspect of the present invention, there is provided a heat sink board including: a heat sink layer; an insulated layer formed on the heat sink layer; and a metal layer formed on the insulated layer, wherein both end parts of the heat sink layer and both end parts of the insulated layer are respectively projected further than the both end parts of the metal layer.

The both end parts of the heat sink layer and the both end parts of the insulated layer may be placed at the same imaginary lines and the both end parts of the insulated layer may be placed at an outer side compared with the both end parts of the metal layer.

The both end parts of the heat sink layer may be placed at an outer side compared with the both end parts of the insulated layer and the both end parts of the insulated layer may be placed at an outer side compared with the both end parts of the metal layer.

The end part of the insulated layer may be projected further toward the outside than the end part of the metal layer by 5 um to 8 cm.

The end part of the insulated layer may be projected further toward the outside than the end part of the metal layer by 5 um to 8 cm.

The heat sink layer may include a metal conductor or a nonconductor.

The insulated layer may include any one selected from Boron Nitride (BN), ceramic ($Al_2O_3$), aluminum nitride (AlN), and silicon nitride ($Si_3N_4$).

The insulated layer may include 50% to 98% of BN.

Thermal conductivity of the insulated layer may be 5 W to 30 W.

A thickness of the insulated layer may be 10 um to 180 um.

A thickness of the heat sink layer may be 1 mm to 10 mm and a thickness of the metal layer may be 0.2 mm to 1.5 mm.

The thickness of the heat sink layer may be greater than the thickness of the metal layer.

The thickness of the metal layer may be greater than the thickness of the heat sink layer.

According to another aspect of the present invention, there is provided a method of manufacturing a heat sink board including: attaching a sheet-form metal layer on the insulated layer, wherein both end parts of the heat sink layer and both end parts of the insulated layer are respectively projected further than the both end parts of the metal layer.

The method may further include attaching the heat sink layer and the metal layer on the insulated layer by a heat curing process.

According to another aspect of the present invention, there is provided a semiconductor package including: a heat sink board comprising a heat sink layer, an insulated layer formed on the heat sink layer, and a metal layer formed on the insulated layer; at least one semiconductor chip placed on the metal layer; a plurality of lead frames connected to the semiconductor chip used to electrically connect the semiconductor chip to the outside; a package housing partially covering the heat sink board, wherein both end parts of the heat sink layer and both end parts of the insulated layer are respectively projected further than the both end parts of the metal layer.

The both end parts of the heat sink layer and the both end parts of the insulated layer may be placed at the same imaginary lines and the both end parts of the insulated layer may be placed at an outer side compared with the both end parts of the metal layer.

The both end parts of the heat sink layer may be placed at an outer side compared with the both end parts of the insulated layer and the both end parts of the insulated layer may be placed at an outer side compared with the both end parts of the metal layer.

The end part of the insulated layer may be projected further toward the outside than the end part of the metal layer by 5 um to 8 cm.

The end part of the heat sink layer may be projected further toward the outside than the end part of the insulated layer by 1 um to 5 cm.

A thickness of the insulated layer may be 10 um to 180 um.

A thickness of the heat sink layer may be 1 mm to 10 mm and a thickness of the metal layer may be 0.2 mm to 1.5 mm.

More than 50% of area of the heat sink board may be exposed to the outside of the package housing.

The semiconductor package further includes a plurality of connecting members for electrically connecting the plurality of semiconductor chips to each other, wherein the connecting members may include a metal clip or a metal spacer and may be attached to a chip pad of the semiconductor chips.

The semiconductor chips may include any one selected from metal-oxide semiconductor filed effect transistor (MOSFET), insulated gate bipolar transistor (IGBT), and diode.

The semiconductor chips may be formed of any one selected from silicon (Si), silicon carbide (SiC), and gallium nitride (GaN).

The package housing may be formed of any one selected from epoxy molding compound (EMC), polybutylene terephthalate (PBT), and polyphenylene sulfide (PPS).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

Figure 1:
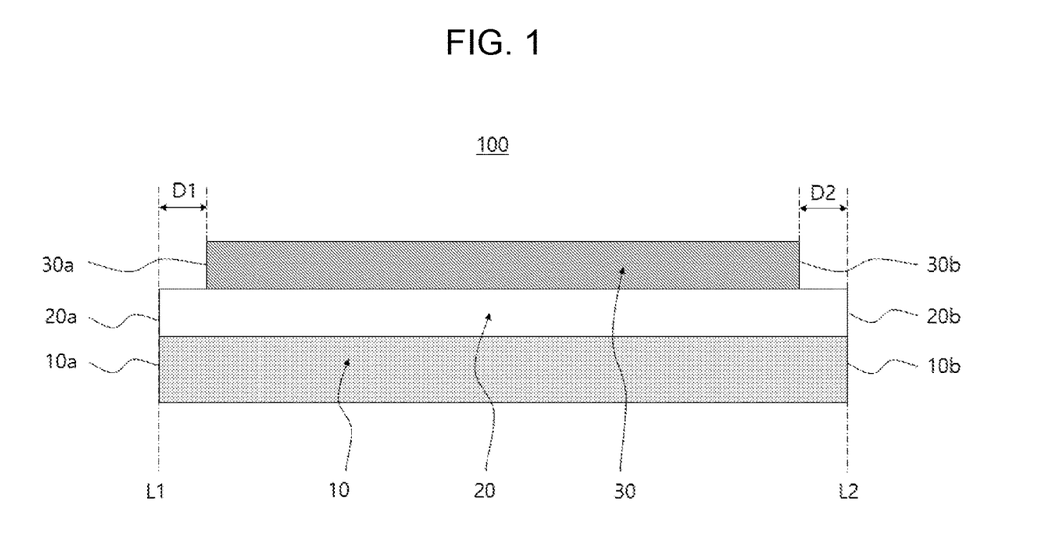
FIG. 1 is a cross-sectional view of a heat sink board according to an embodiment of the present invention.
Figure 2:
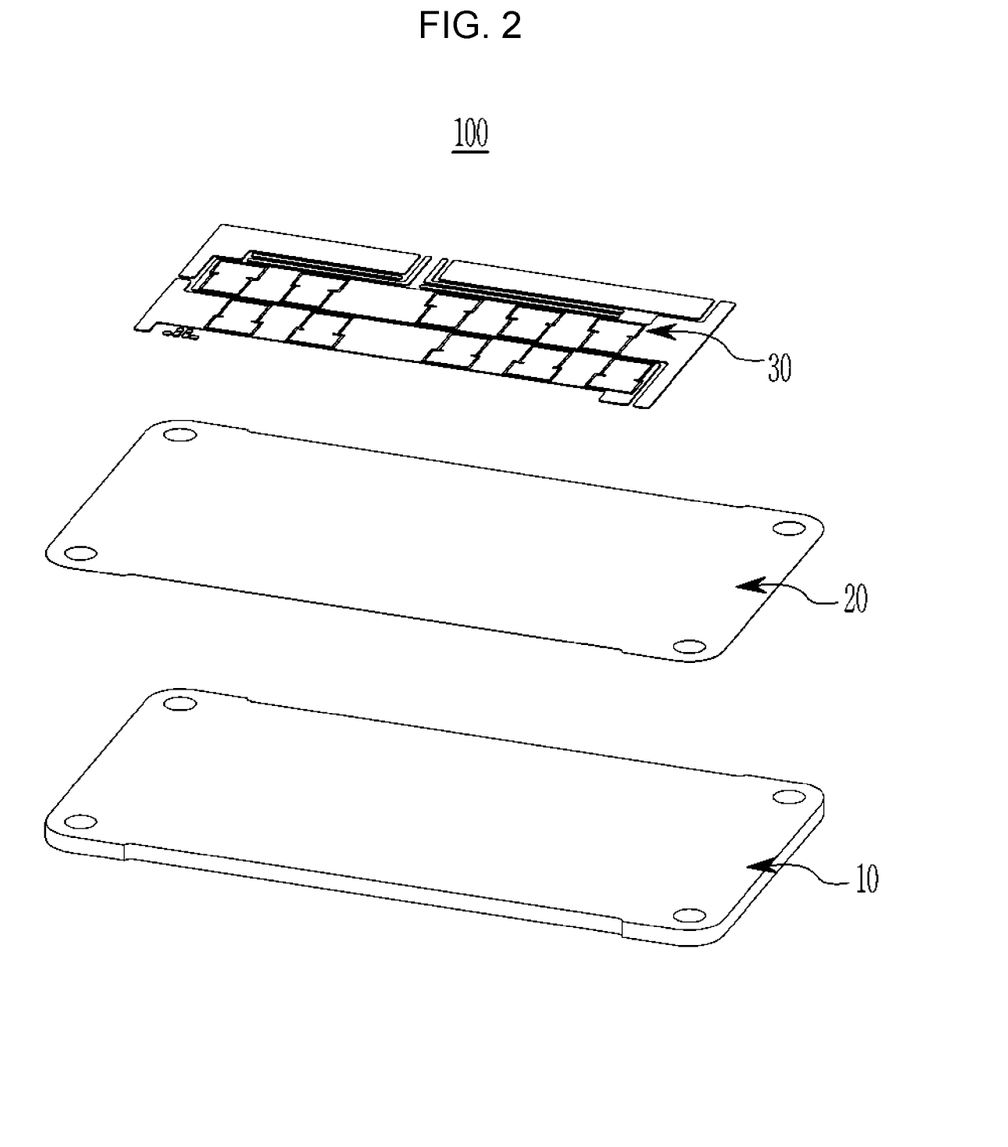
FIG. 2 is a perspective view of a heat sink board according to an embodiment of the present invention.

FIG. 1 is a cross-sectional view of a heat sink board 100 according to an embodiment of the present invention and FIG. 2 is a perspective view of the heat sink board 100 according to an embodiment of the present invention.

As illustrated in FIGS. 1 and 2, the heat sink board 100 according to an embodiment of the present invention includes a heat sink layer 10, an insulated layer 20 formed on the heat sink layer 10, and a metal layer 30 formed on the insulated layer 20.

The heat sink layer 10 may include a metal conductor or a nonconductor having thermal conduction quality. A thickness of the heat sink layer 10 may be 1 mm to 10 mm.

The insulated layer 20 may include any one selected from Boron Nitride (BN), ceramic ($Al_2O_3$), aluminum nitride (AlN), and silicon nitride ($Si_3N_4$). In particular, when the insulated layer 20 includes BN, the insulated layer 20 may include 50% to 98% of BN. Thermal conductivity of the insulated layer 20 may be 5 W to 30 W and a thickness of the insulated layer 20 may be 10 um to 180 um.

A thickness of the metal layer 30 may be 0.2 mm to 1.5 mm. Here, the thickness of the heat sink layer 10 may be greater than the thickness of the metal layer 30. In this case, the heat sink layer 10 may be used to release more heat. However, the present invention is not limited thereto and the thickness of the metal layer 30 may be greater than the thickness of the heat sink layer 10.

Both end parts 10a and 10b of the heat sink layer 10 may be projected further toward the outside than both end parts 30a and 30b of the metal layer 30 and both end parts 20a and 20b of the insulated layer 20 may be projected further toward the outside than the both end parts 30a and 30b of the metal layer 30.

More specifically, the both end parts 10a and 10b of the heat sink layer 10 and the both end parts 20a and 20b of the insulated layer 20 are placed at the same imaginary lines L1 and L2. Also, the both end parts 10a and 10b of the heat sink layer 10 and the both end parts 20a and 20b of the insulated layer 20 may all be placed at outer side compared with the both end parts 30a and 30b of the metal layer 30.

Here, the end part 10a of the heat sink layer 10 or the end part 20a of the insulated layer 20 may be projected further toward the outside than the end part 30a of the metal layer 30 by a first projected length D1 of 5 um to 8 cm. As in the same manner, the other end part 10b of the heat sink layer 10 or the other end part 20b of the insulated layer 20 may be projected further toward the outside than the other end part 30b of the metal layer 30 by a second projected length D2 of 5 um to 8 cm.

Here, the first projected length D1 and the second projected length D2 may be the same or different from each other.

As described above, the thickness of the insulated layer 20 is smaller than the each of the thicknesses of the heat sink layer 10 and the metal layer 30 and the both end parts 20a and 20b of the insulated layer 20 are not projected further toward the outside than the both end parts 10a and 10b of the heat sink layer 10. Accordingly, damage occurring due to outside shock may be reduced in the insulated layer 20.

Hereinafter, a method of manufacturing the heat sink board 100 illustrated in FIGS. 1 and 2 above will be described in detail.

Figure 3:
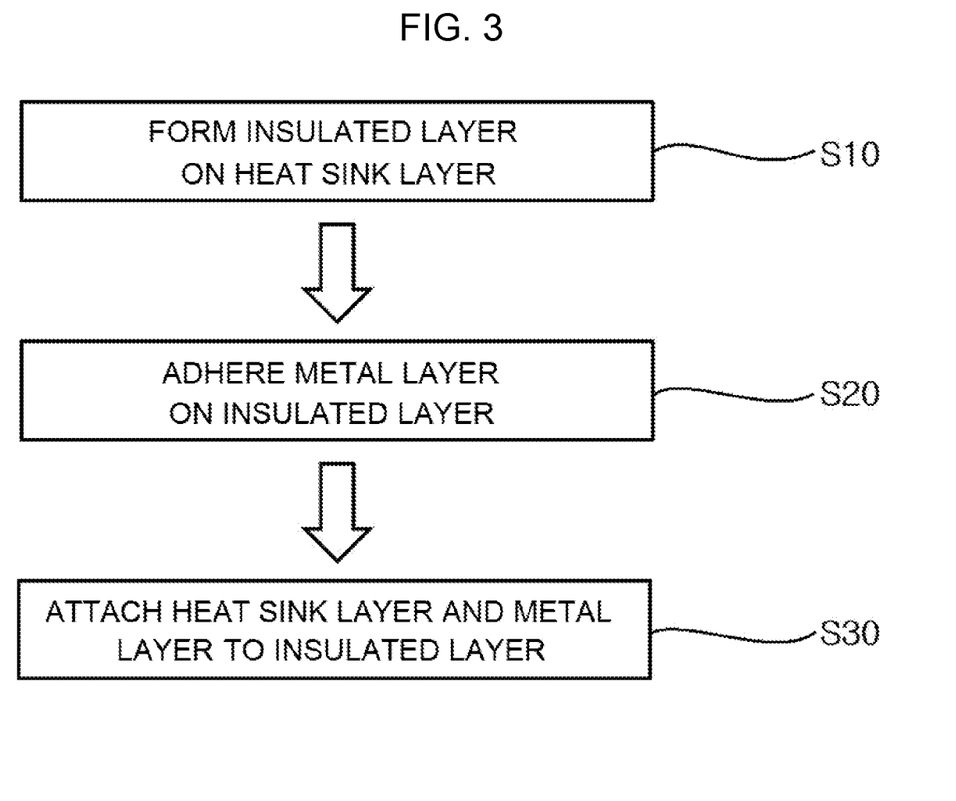
FIG. 3 is a flowchart illustrating a method of manufacturing a heat sink board according to an embodiment of the present invention.

FIG. 3 is a flowchart illustrating a method of manufacturing the heat sink board 100 according to an embodiment of the present invention.

As illustrated in FIG. 3, the method of manufacturing the heat sink board 100 firstly includes forming of the insulated layer 20 on the heat sink layer 10 in a sheet form by using a printing process or a coating process, in operation S10. Since the sheet-form heat sink layer 10 is used, the heat sink layer 10 having an increased thickness may be formed and thus, manufacturing costs may be reduced so that heat emission effect may be greatly increased. Also, the insulated layer 20 having a small thickness may be formed without using additional insulated board and thus, manufacturing costs may be reduced.

Then, the metal layer 30 in a sheet form is attached on the insulated layer 20, in operation S20. Since the sheet-form metal layer 30 is used, the metal layer 30 having an increased thickness may be formed and thus, manufacturing costs may be reduced so that heat emission effect may be increased.

Here, the both end parts 10a and 10b of the heat sink layer 10 may be projected further than the both end parts 30a and 30b of the metal layer 30 and the both end parts 20a and 20b of the insulated layer 20 may be projected further than the both end parts 30a and 30b of the metal layer 30.

Next, a heat curing process is performed to attach the heat sink layer 10 and the metal layer 30 respectively to upper and lower parts of the insulated layer 20, in operation S30.

According to an embodiment of the present invention, the both end parts 10a and 10b of the heat sink layer 10 and the both end parts 20a and 20b of the insulated layer 20 are placed at the same imaginary lines. However, in another embodiment of the present invention, the both end parts 10a and 10b of the heat sink layer 10 may be placed at an outer side compared with the both end parts 20a and 20b of the insulated layer 20.

Hereinafter, the heat sink board 100 according to another embodiment of the present invention will be described in detail with reference to FIG. 4.

Figure 4:
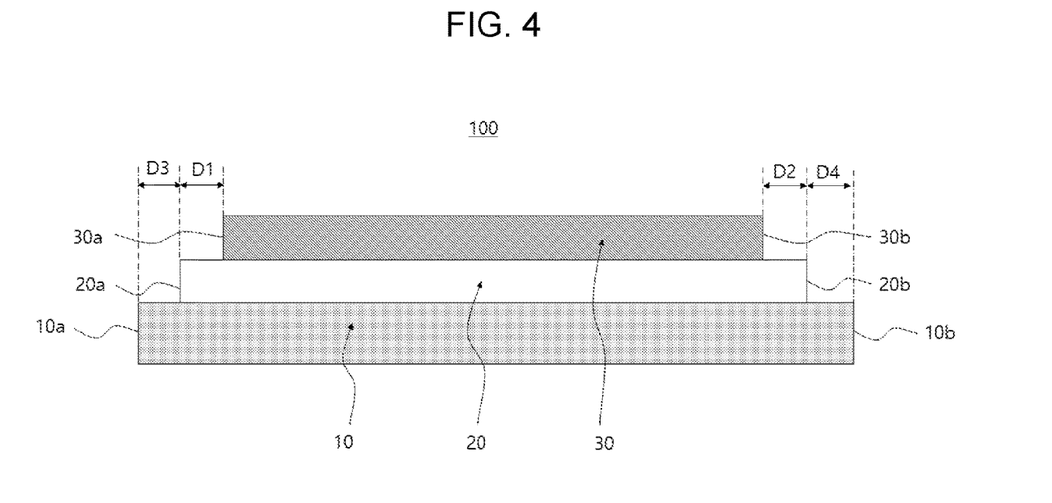
FIG. 4 is a cross-sectional view of a heat sink board according to another embodiment of the present invention.

FIG. 4 is a cross-sectional view of the heat sink board 100 according to another embodiment of the present invention.

The description in the embodiment illustrated in FIG. 4 is the same as that of in the embodiment illustrated in FIGS. 1 and 2 except for structures of a heat sink layer and an insulation layer and thus, the same description is omitted herein.

As illustrated in FIG. 4, the heat sink board 100 according to another embodiment of the present invention includes the heat sink layer 10, the insulated layer 20 formed on the heat sink layer 10, and the metal layer 30 formed on the insulated layer 20. A thickness of the insulated layer 20 may be 10 um to 180 um.

The both end parts 10a and 10b of the heat sink layer 10 may be projected further than the both end parts 30a and 30b of the metal layer 30 and the both end parts 20a and 20b of the insulated layer 20 may be projected further than the both end parts 30a and 30b of the metal layer 30.

More specifically, the both end parts 10a and 10b of the heat sink layer 10 may be placed at an outer side compared with the both end parts 30a and 30b of the metal layer 30 and the both end parts 20a and 20b of the insulated layer 20 may be placed at an outer side compared with the both end parts 30a and 30b of the metal layer 30. That is, the end part 10a of the heat sink layer 10, the end part 20a of the insulated layer 20, and the end part 30a of the metal layer 30 may have a step-form. As in the same manner, the other end part 10b of the heat sink layer 10, the other end part 20b of the insulated layer 20, and the other end part 30b of the metal layer 30 may have a step-form.

Here, the end part 20a of the insulated layer 20 may be projected further toward the outside than the end part 30a of the metal layer 30 by the first projected length D1 of 5 um to 8 cm. As in the same manner, the other end part 20b of the insulated layer 20 may be projected further toward the outside than the other end part 30b of the metal layer 30 by the second projected length D2 of 5 um to 8 cm. Here, the first projected length D1 and the second projected length D2 may be the same or different from each other.

Also, the end part 10a of the heat sink layer 10 may be projected further toward the outside than the end part 20a of the insulated layer 20 by a third projected length D3 of 1 um to 5 cm. As in the same manner, the other end part 10b of the heat sink layer 10 may be projected further toward the outside than the other end part 20b of the insulated layer 20 by a fourth projected length D4 of 1 um to 5 cm. Here, the third projected length D3 and the fourth projected length D4 may be the same or different from each other.

Figure 5:
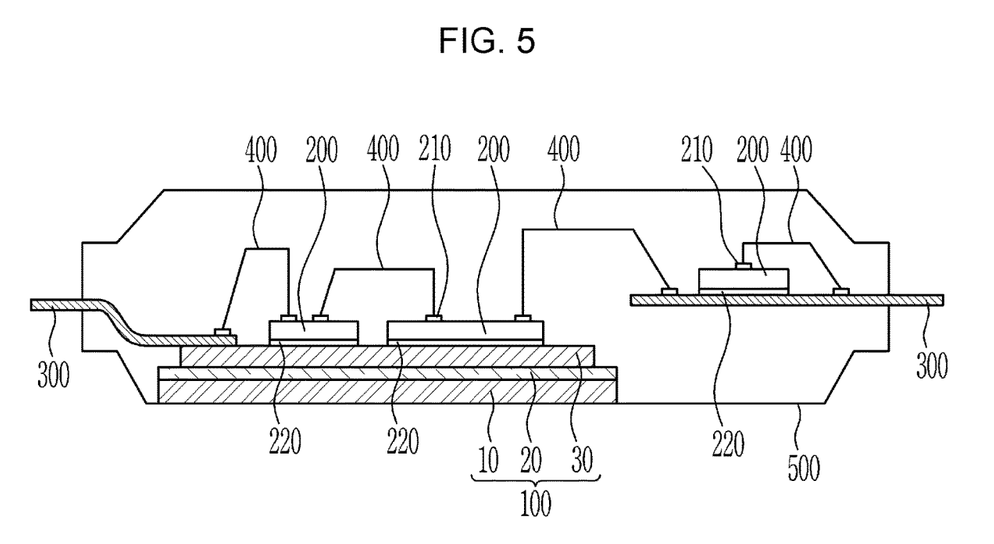
FIG. 5 is a cross-sectional view of a semiconductor package according to an embodiment of the present invention.
Figure 6:
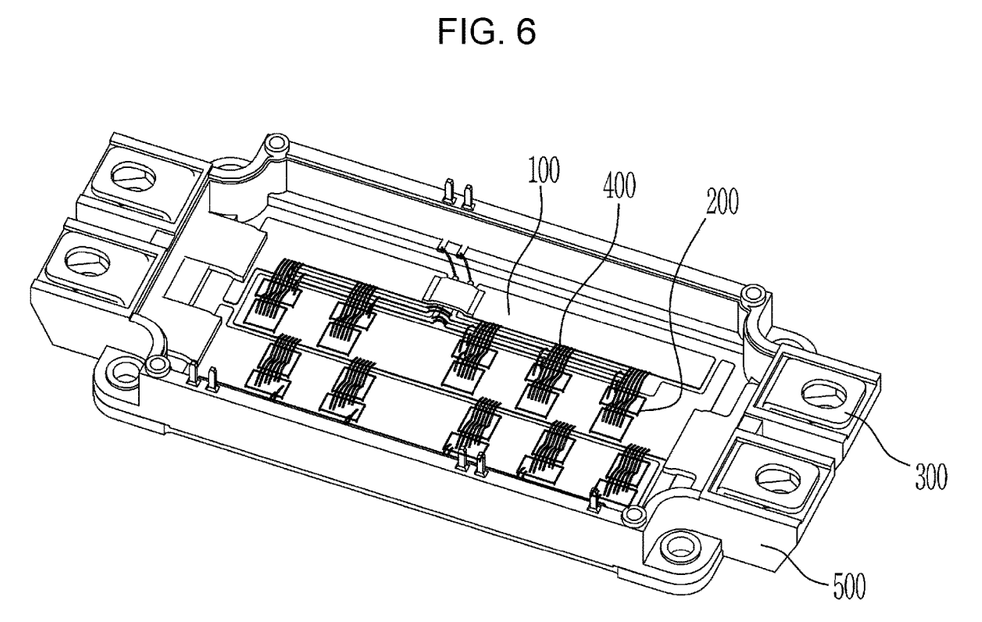
FIG. 6 is a perspective view of a semiconductor package according to an embodiment of the present invention.
Figure 7:
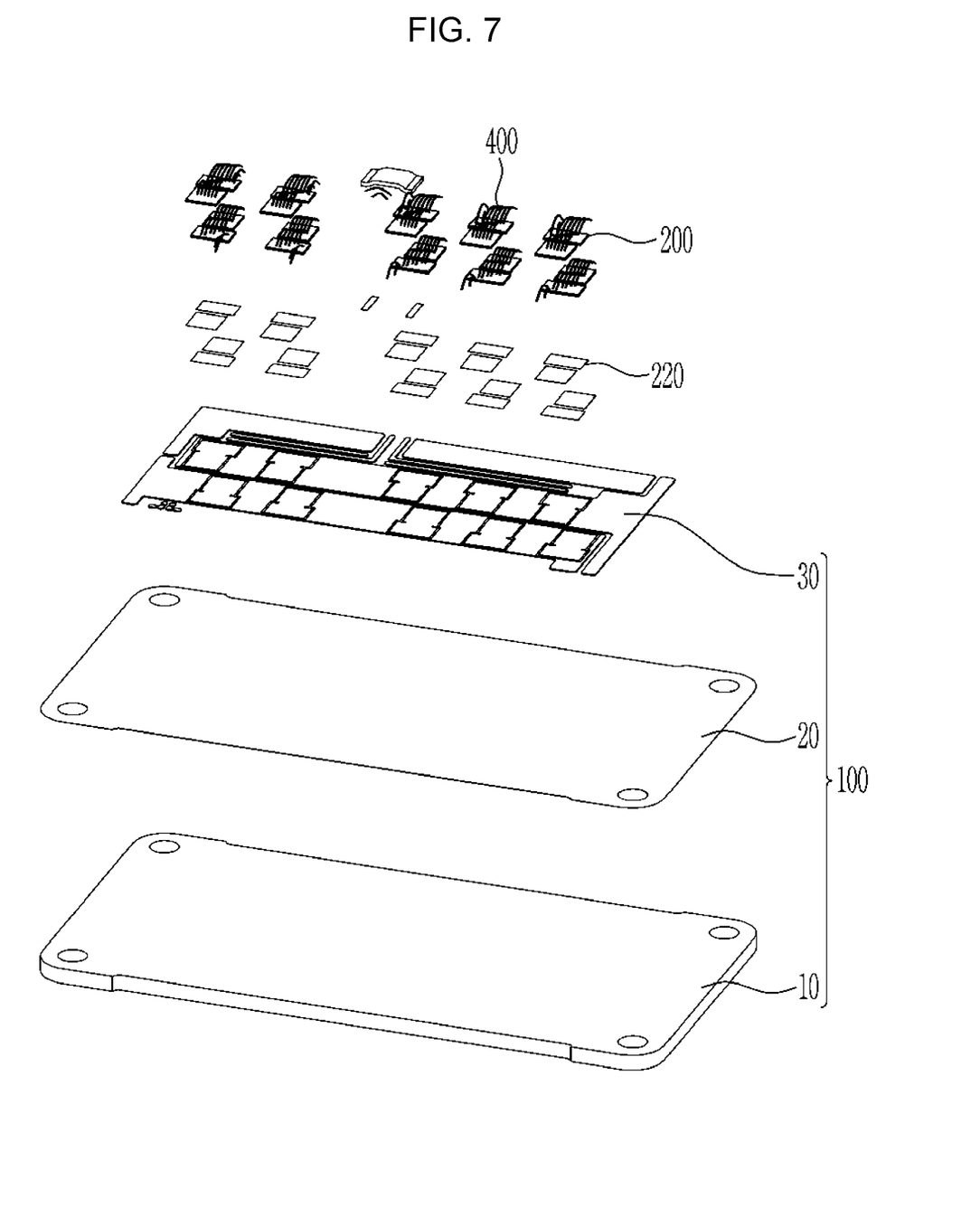
FIG. 7 is an exploded perspective view of a part in FIG. 6.
Figure 8:
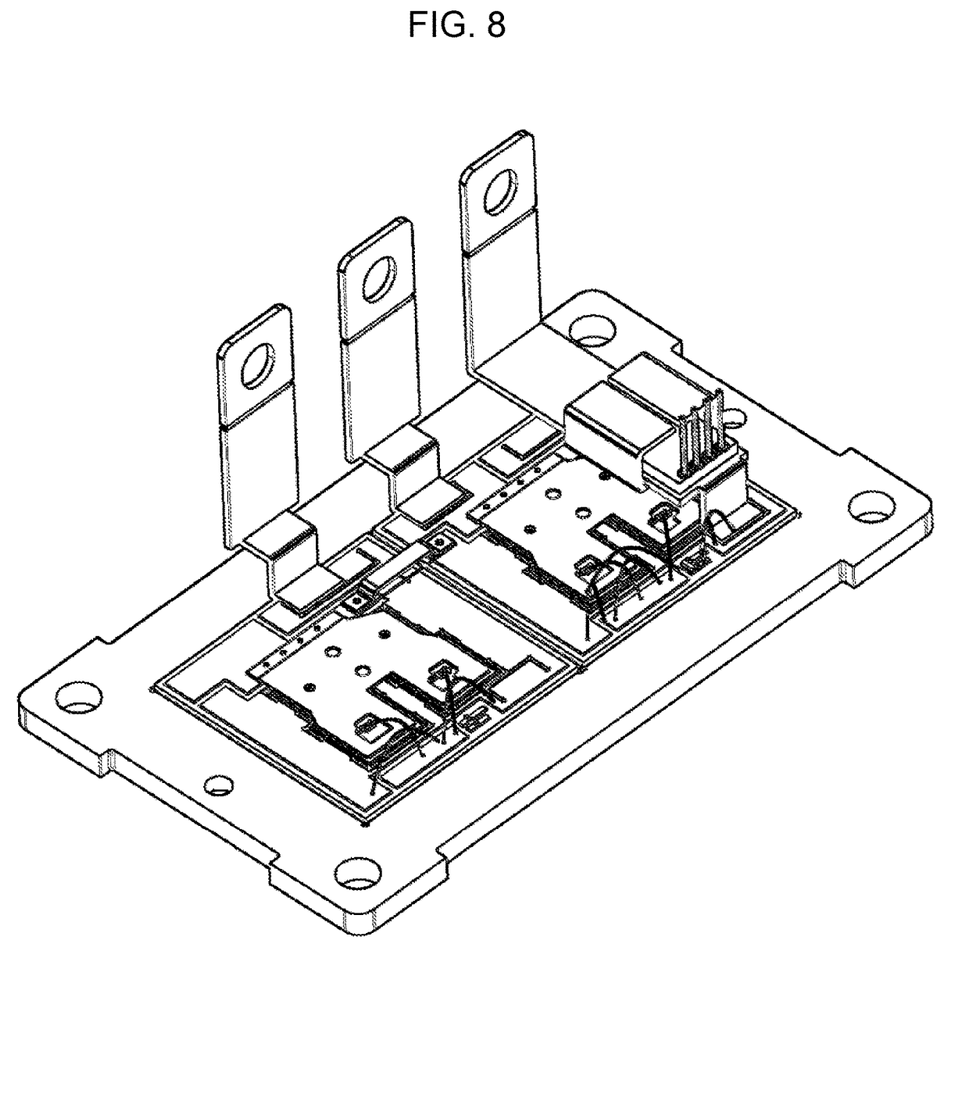
FIG. 8 is an enlarged perspective view of a metal clip connected to a lead frame illustrated in FIG. 6.

FIG. 5 is a cross-sectional view of a semiconductor package according to an embodiment of the present invention, FIG. 6 is a perspective view of a semiconductor package according to an embodiment of the present invention, FIG. 7 is an exploded perspective view of a part in FIG. 6, and FIG. 8 is an enlarged perspective view of a metal clip connected to a lead frame illustrated in FIG. 6.

As illustrated in FIGS. 1, 2, and 5 through 8, a semiconductor package according to an embodiment of the present invention includes the heat sink board 100, at least one semiconductor chip 200, a plurality of lead frames 300, a plurality of connecting members 400, and a package housing 500.

The heat sink board 100 includes the heat sink layer 10, the insulated layer 20 formed on the heat sink layer 10, and the metal layer 30 formed on the insulated layer 20.

The heat sink layer 10 may include a metal conductor or a nonconductor having thermal conduction quality. A thickness of the heat sink layer 10 may be 1 mm to 10 mm.

The insulated layer 20 may include any one selected from Boron Nitride (BN), ceramic ($Al_2O_3$), aluminum nitride (AlN), and silicon nitride ($Si_3N_4$). In particular, when the insulated layer 20 includes BN, the insulated layer 20 may include 50% to 98% of BN. Thermal conductivity of the insulated layer 20 may be 5 W to 30 W and a thickness of the insulated layer 20 may be 10 um to 180 um.

A thickness of the metal layer 30 may be 0.2 mm to 1.5 mm. Here, the thickness of the heat sink layer 10 may be greater than the thickness of the metal layer 30. In this case, the heat sink layer 10 may be used to release more heat. However, the present invention is not limited thereto and the thickness of the metal layer 30 may be greater than the thickness of the heat sink layer 10.

The both end parts 10a and 10b of the heat sink layer 10 may be projected further than the both end parts 30a and 30b of the metal layer 30 and the both end parts 20a and 20b of the insulated layer 20 may be projected further than the both end parts 30a and 30b of the metal layer 30. More specifically, the both end parts 10a and 10b of the heat sink layer 10 and the both end parts 20a and 20b of the insulated layer 20 are placed at the same imaginary lines L1 and L2. Also, the both end parts 10a and 10b of the heat sink layer 10 and the both end parts 20a and 20b of the insulated layer 20 may all be placed at outer side compared with the both end parts 30a and 30b of the metal layer 30. Here, the end part 10a of the heat sink layer 10 or the end part 20a of the insulated layer 20 may be projected further toward the outside than the end part 30a of the metal layer 30 by the first projected length D1 of 5 um to 8 cm. As in the same manner, the other end part 10b of the heat sink layer 10 or the other end part 20b of the insulated layer 20 may be projected further toward the outside than the other end part 30b of the metal layer 30 by the second projected length D2 of 5 um to 8 cm. Here, the first projected length D1 and the second projected length D2 may be the same or different from each other.

As described above, the thickness of the insulated layer 20 is smaller than the each of the thicknesses of the heat sink layer 10 and the metal layer 30 and the both end parts 20a and 20b of the insulated layer 20 are not projected further toward the outside than the both end parts 10a and 10b of the heat sink layer 10. Accordingly, damage occurring due to outside shock may be reduced in the insulated layer 20.

The heat sink board 100 according to an embodiment of the present invention illustrated in FIGS. 5 through 8 is applied from the heat sink board 100 illustrated in FIGS. 1 and 2. However, the present invention is not limited thereto and the heat sink board 100 according to another embodiment of the present invention illustrated in FIG. 4 may be applicable.

As illustrated in FIGS. 5 through 8, the semiconductor chips 200 may be placed on the metal layer 30. Such semiconductor chips 200 may be attached to the metal layer 30 by using a conductive adhesive 220.

The semiconductor chips 200 may include any one selected from metal-oxide semiconductor filed effect transistor (MOSFET), insulated gate bipolar transistor (IGBT), and diode. Such semiconductor chips 200 may be formed of any one selected from silicon (Si), silicon carbide (SiC), and gallium nitride (GaN). The semiconductor chips 200 may include a chip pad 210 used to electrically connect to the connecting members 400.

The plurality of connecting members 400 may be used to electrically connect the plurality of semiconductor chips 200 to each other. The connecting members 400 may include a metal clip or a metal spacer and FIG. 8 illustrates the connecting members 400 formed in metal clips. The connecting members 400 may be attached and electrically connected to the chip pads 210 of the semiconductor chips 200

The lead frames 300 are connected to the semiconductor chips 200 through the plurality of connecting members 400 and electrically connect the semiconductor chips 200 to the outside.

Here, the lead frames 300 may be attached to the metal layer 30 of the heat sink board 100 by an ultrasonic welding process without using an additional conductive adhesive.

The package housing 500 may partially cover the heat sink board 100 in order to protect the heat sink board 100. Here, more than 50% of area of the heat sink board 100 may be exposed to the outside of the package housing 500. Accordingly, heat emission effect may be greatly increased. Such a package housing 500 may be formed of any one selected from epoxy molding compound (EMC), polybutylene terephthalate (PBT), and polyphenylene sulfide (PPS).

In the heat sink board according to an embodiment of the present invention, an insulated layer is formed by a printing process or a coating process without using an additional insulated board and thus, manufacturing costs may be reduced.

Also, a thickness of an insulated layer is smaller than each of thicknesses of a heat sink layer and a metal layer, and both end parts of the insulated layer are not projected further toward the outside than both end parts of the heat sink layer. Accordingly, damage occurring due to outside shock may be reduced in the insulated layer.

In addition, since sheet-form heat sink layer and metal layer are used, the heat sink layer and the metal layer both having increased thicknesses may be formed and thus, manufacturing costs may be reduced so that heat emission effect may be greatly increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A heat sink board comprising:
   a heat sink layer;
   an insulated layer formed on the heat sink layer; and
   a metal layer formed on the insulated layer,
   wherein both end parts of the heat sink layer and both end parts of the insulated layer are respectively projected further than the both end parts of the metal layer,
   wherein a thickness of the insulated layer is 10 um to 180 um,
   a thickness of the heat sink layer is 1 mm to 10 mm and a thickness of the metal layer is 0.2 mm to 1.5 mm.

2. The heat sink board of claim 1, wherein the both end parts of the heat sink layer and the both end parts of the insulated layer are placed at the same imaginary lines and the both end parts of the insulated layer are placed at an outer side compared with the both end parts of the metal layer.

3. The heat sink board of claim 1, wherein the both end parts of the heat sink layer are placed at an outer side compared with the both end parts of the insulated layer and the both end parts of the insulated layer are placed at an outer side compared with the both end parts of the metal layer.

4. The heat sink board of claim 2, wherein the end part of the insulated layer is projected further toward the outside than the end part of the metal layer by 5 um to 8 cm.

5. The heat sink board of claim 3, wherein the end part of the insulated layer is projected further toward the outside than the end part of the metal layer by 5 um to 8 cm.

6. The heat sink board of claim 3, wherein the end part of the heat sink layer is projected further toward the outside than the end part of the insulated layer by 1 um to 5 cm.

7. The heat sink board of claim 1, wherein a thickness of the heat sink layer is greater than a thickness of the metal layer.

8. A method of manufacturing a heat sink board comprising:
   forming an insulated layer on a heat sink layer by a printing process or a coating process; and
   attaching a sheet-form metal layer on the insulated layer,
   wherein both end parts of the heat sink layer and both end parts of the insulated layer are respectively projected further than the both end parts of the metal layer,
   wherein a thickness of the insulated layer is 10 um to 180 um,
   a thickness of the heat sink layer is 1 mm to 10 mm and a thickness of the metal layer is 0.2 mm to 1.5 mm.

9. The method of claim 8, further comprising attaching the heat sink layer and the metal layer on the insulated layer by a heat curing process.

10. The heat sink board of claim 8, wherein a thickness of the heat sink layer is greater than a thickness of the metal layer.

11. A semiconductor package comprising:
    a heat sink board comprising a heat sink layer, an insulated layer formed on the heat sink layer, and a metal layer formed on the insulated layer;
    at least one semiconductor chip placed on the metal layer;
    a plurality of lead frames connected to the semiconductor chip used to electrically connect the semiconductor chip to the outside; and
    a package housing partially covering the heat sink board,
    wherein both end parts of the heat sink layer and both end parts of the insulated layer are respectively projected further than the both end parts of the metal layer, wherein a thickness of the insulated layer is 10 um to 180 um,
a thickness of the heat sink layer is 1 mm to 10 mm and
a thickness of the metal layer is 0.2 mm to 1.5 mm.

12. The semiconductor package of claim 11, wherein the both end parts of the heat sink layer and the both end parts of the insulated layer are placed at the same imaginary lines and the both end parts of the insulated layer are placed at an outer side compared with the both end parts of the metal layer.

13. The semiconductor package of claim 11, wherein the both end parts of the heat sink layer are placed at an outer side compared with the both end parts of the insulated layer and the both end parts of the insulated layer are placed at an outer side compared with the both end parts of the metal layer.

14. The semiconductor package of claim 12, wherein the end part of the insulated layer is projected further toward the outside than the end part of the metal layer by 5 um to 8 cm.

15. The semiconductor package of claim 13, wherein the end part of the insulated layer is projected further toward the outside than the end part of the metal layer by 5 um to 8 cm.

16. The semiconductor package of claim 13, wherein the end part of the heat sink layer is projected further toward the outside than the end part of the insulated layer by 1 um to 5 cm.

17. The heat sink board of claim 11, wherein a thickness of the heat sink layer is greater than a thickness of the metal layer.

\* \* \* \* \*